(12) United States Patent
Wada et al.

(10) Patent No.: US 7,071,577 B2
(45) Date of Patent: Jul. 4, 2006

(54) SEMICONDUCTOR DEVICE AND RESIN BINDER FOR ASSEMBLING SEMICONDUCTOR DEVICE

(75) Inventors: Yoshiyuki Wada, Fukuoka (JP); Tadahiko Sakai, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/684,685

(22) Filed: Oct. 15, 2003

(65) Prior Publication Data

US 2004/0080047 A1    Apr. 29, 2004

(30) Foreign Application Priority Data

Oct. 25, 2002  (JP)  ............................. 2002-310736
Oct. 25, 2002  (JP)  ............................. 2002-310737

(51) Int. Cl.
  *H01L 23/29*  (2006.01)
  *H01L 23/28*  (2006.01)
  *H01L 23/10*  (2006.01)
  *H01L 23/34*  (2006.01)

(52) U.S. Cl. ..................... 257/789; 257/707; 257/783; 257/787; 257/E23.121

(58) Field of Classification Search ............... 257/707, 257/783, 789, 787, E23.121
See application file for complete search history.

(56) References Cited

U.S. PATENT DOCUMENTS

| 4,388,132 A | 6/1983 | Hoge et al. |
| 4,818,812 A | 4/1989 | Economy et al. |
| 5,308,980 A * | 5/1994 | Barton ................. 250/338.4 |
| 6,255,376 B1 * | 7/2001 | Shikata et al. ............ 524/404 |
| 6,255,738 B1 * | 7/2001 | Distefano et al. ........... 257/788 |
| 6,376,907 B1 * | 4/2002 | Takano et al. ............. 257/704 |
| 6,387,734 B1 * | 5/2002 | Inaba et al. ............... 438/125 |
| 6,617,675 B1 | 9/2003 | Sakai et al. |
| 2002/0058743 A1 * | 5/2002 | Tobita et al. .............. 524/495 |

FOREIGN PATENT DOCUMENTS

JP  10-135386    5/1998
JP  2002-141439  5/2002

* cited by examiner

*Primary Examiner*—Nitin Parekh
(74) *Attorney, Agent, or Firm*—Wenderoth, Lind & Ponack, L.L.P.

(57) ABSTRACT

In a semiconductor device of a structure comprising a thin semiconductor element bonded to a reinforcing plate via a bonding layer of a predetermined thickness, resin binder used for forming the bonding layer contains fillers including a first filler, which has a diameter generally equal to a target thickness of the bonding layer to be adjusted to a value within a range of proper thickness (from 25 μm to 200 μm). This can maintain the bonding layer within the range of proper thickness when the semiconductor element is bonded to the plate, and ensure on-board mounting reliability of the semiconductor device.

10 Claims, 13 Drawing Sheets

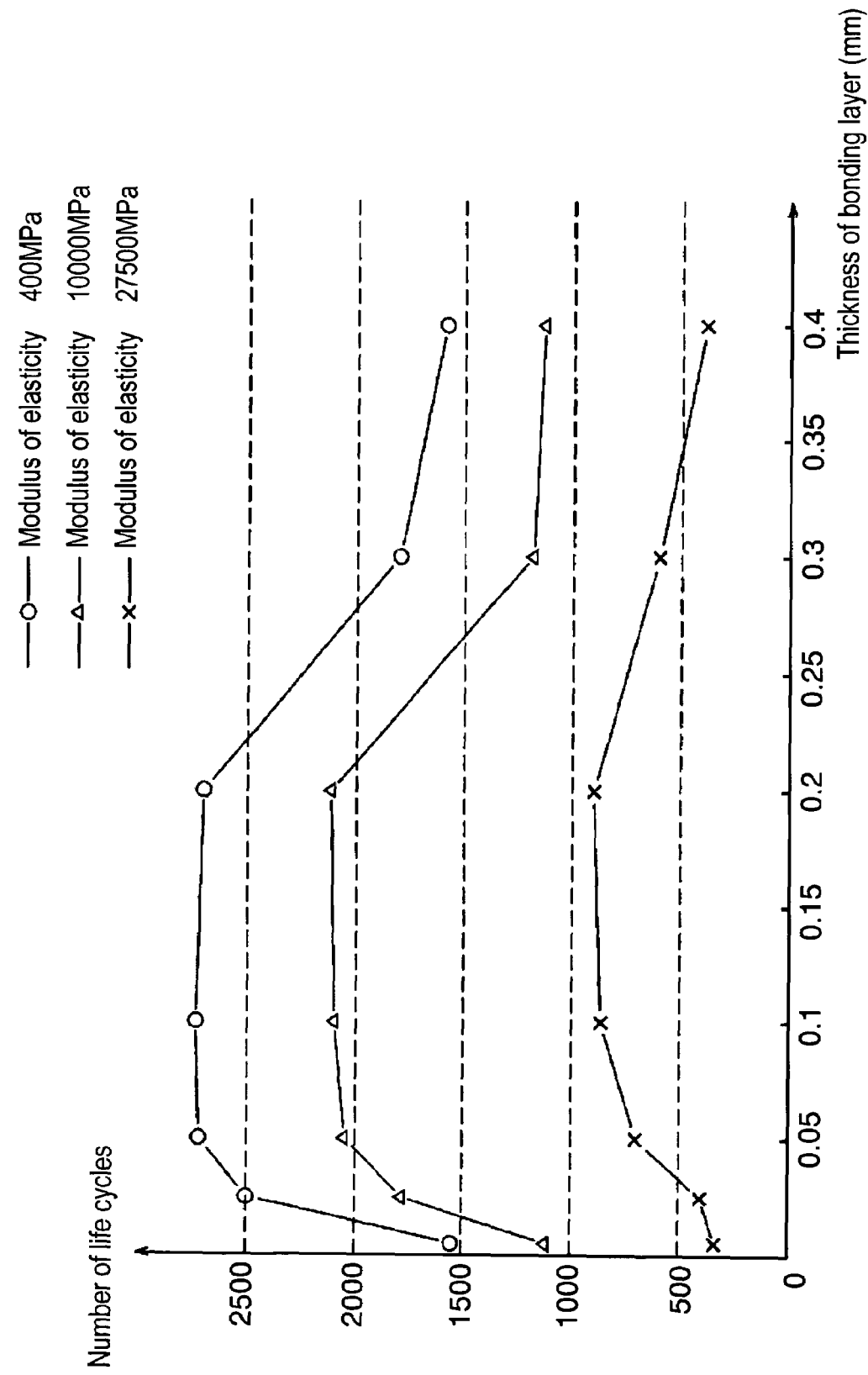

SEMICONDUCTOR DEVICE AND RESIN BINDER FOR ASSEMBLING SEMICONDUCTOR DEVICE

TECHNICAL FIELD

The present invention relates to a semiconductor device provided with a plate bonded to a back surface of a semiconductor element for protection of the semiconductor element.

BACKGROUND OF THE INVENTION

As a mounting structure of an electronic component manufactured with a semiconductor element in a form of a package to be mounted onto a circuit board, there is a known structure in which protruding electrodes such as solder bumps are formed on the electronic component and connected to the circuit board. In any such mounting structure, it is necessary to reduce a magnitude of thermal stress during heat cycle testing in order to ensure reliability of bonding after mounting. In other words, it is essential to reduce thermal stress developed in bonded areas between the semiconductor element and the solder bumps caused by changes in a surrounding temperature after the mounting due to a difference in coefficient of thermal expansion between the semiconductor element and associated structure.

SUMMARY OF THE INVENTION

The present invention is intended to provide a semiconductor device having an outstanding on-board mounting reliability. The semiconductor device comprises a plate bonded to a back surface of a thin semiconductor element in which a thickness of a bonding layer is adjusted to be within a predetermined range.

BRIEF DESCRIPTION OF THE DRAWINGS

FIG. 8 is a graphical representation showing a result of simulation for a number of life cycles against thermal fatigue (−40° C. to 125° C.) on the semiconductor device of the first exemplary embodiment of this invention.

DETAILED DESCRIPTION OF THE PREFERRED EMBODIMENTS

We made some attempts to produce a semiconductor element with as small a thickness as possible for a purpose of minimizing thermal stress developed in bonded areas between the semiconductor element and solder bumps.

In Japanese Patent Unexamined Publication, No. 2002-141439, the applicants of this application disclosed a new semiconductor device packaged with a thinly processed semiconductor element. As this semiconductor device comprises a plate (i.e. a structural member) bonded to a back side of the semiconductor element with resin binder, it has such advantages as being easy to handle and improving reliability of bonding at the same time by allowing deformation of the semiconductor element itself and distributing stress in bonded areas.

Since thickness of a bonding layer of resin binder appears to influence greatly with regard to on-board mounting reliability of a semiconductor device of the above structure, we made studies in an attempt to determine a correlation between thickness of the bonding layer and the on-board mounting reliability. It was found as a result that there is a tendency that this reliability improves as thickness of the bonding layer increases within a specific range when the bonding layer is relatively thin, and that the reliability decreases when the bonding layer exceeds a certain thickness. It was therefore determined effective to adjust the bonding layer to a proper thickness to achieve as much reduction of thickness as feasible of a completed semiconductor device while ensuring on-board mounting reliability at the same time.

First Exemplary Embodiment

Referring now to FIG. 1A through FIG. 8, description will be provided of a first exemplary embodiment.

Figure 1A:
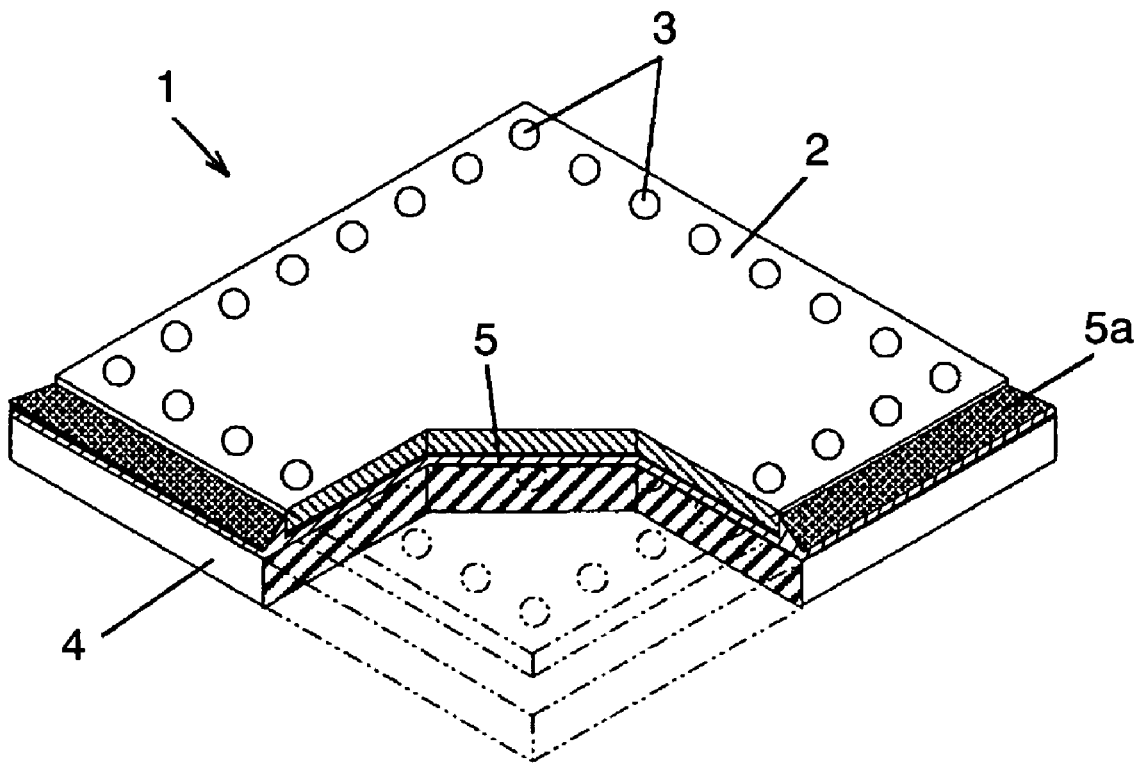
FIG. 1A is a perspective view of a semiconductor device according to a first exemplary embodiment of the present invention.
Figure 1B:
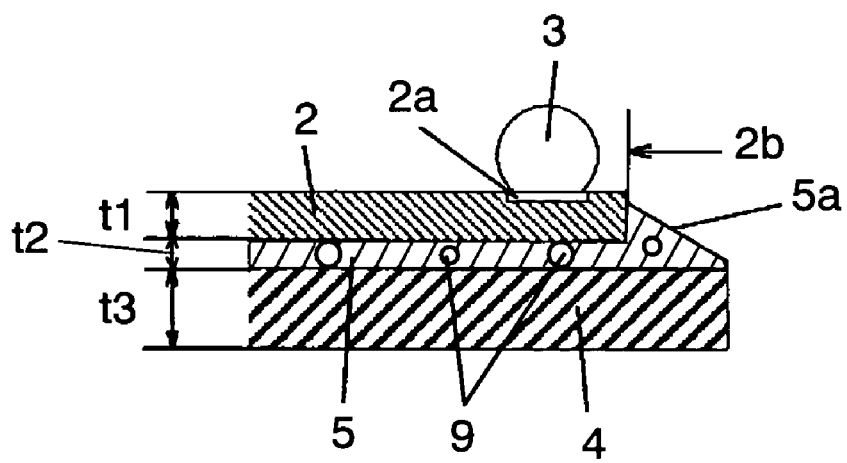
FIG. 1B is a sectional view showing a part of the semiconductor device of the first exemplary embodiment of the invention.

Description first pertains to a semiconductor device. In FIGS. 1A and 1B, semiconductor device 1 has a structure in which plate 4 (i.e. a structural member) for protection of semiconductor element 2 is bonded to a back surface of semiconductor element 2 with resin binder 5 of a predetermined thickness. A plurality of bumps 3 are formed on electrodes 2a provided along a fringe on a surface of semiconductor element 2 to serve as terminals for external connections.

Semiconductor element 2 shown here is in a shape after it has been subjected to a thinning process by performing such methods as machine grinding and etching. When the semiconductor element is mounted to a circuit board via the bumps, bonding reliability after this mounting becomes superior in general as thickness of the semiconductor element is smaller. This is because semiconductor element 2 itself deforms (or bends) in a direction of its thickness and distributes stress caused by a difference in the thermal stress between semiconductor element 2 and the circuit board, even though the stress is apt to concentrate at bonded areas of bumps 3. For this reason, this exemplary embodiment employs a thinning process of semiconductor element 2 to control its thickness "t1" to be at most 100 μm, thereby making it capable of deforming (bending) in the direction of its thickness.

The thinning process includes a rough cutting process performed on a back side of a circuit-carrying surface of semiconductor element 2 by machine grinding using a grindstone and the like, and a finishing process performed by dry etching or wet etching with chemical liquid. The machine grinding produces a damaged layer in which a great number of microcracks are formed on the back side. Since this damaged layer becomes a main factor in decreasing a flexural strength of the semiconductor element, performance of the finishing process removes the damaged layer and increases a flexural strength of semiconductor element 2.

Plate 4 has a function of protecting semiconductor device 1 from external forces after it is mounted to a circuit board or the like, besides a purpose of making semiconductor device 1 steadily retainable during handling when it is being mounted. Therefore, the plate 4 used here is made of a structural material such as metal, ceramic and plastic in a shape which can satisfy the above functions and purpose. In other words, the plate 4 is fabricated into thickness of "t3" to obtain sufficient strength and rigidity to withstand the external forces, and an external shape larger than that of semiconductor element 2.

The bonding layer comprising resin binder 5 used here between semiconductor element 2 and plate 4 shall be a material that provides for not only adhesion to bond semiconductor element 2 to plate 4, but also a property to satisfy the above function and purpose. In other words, the bonding layer is required to have a property, which assures strength of semiconductor device 1 by bonding semiconductor element 2 to plate 4 with necessary and sufficient adhesion, and allows as much deformation of semiconductor element 2 as possible in the direction of its thickness. In semiconductor device 1 illustrated in this first exemplary embodiment, therefore, resin layer formed of resin binder 5 is made to be easily deformable by adjusting a modulus of elasticity to be at most 10,000 Mpa, as will be described later. In addition, a thickness of the bonding layer for bonding semiconductor element 2 to plate 4 is adjusted to the proper thickness of "t2" which is described hereinafter.

Thickness "t2" of the bonding layer is set to be a value within a range of 25 μm to 200 μm based on a result of numeric simulation (described later) resulting from performance of a finite element method with regard to a relationship between thickness of the bonding layer and number of life cycles. Resin binder 5 as will be described next having the thickness "t2" adjusted within the above range allows semiconductor element 2 to deform in a manner to follow deformation of a circuit board when semiconductor device 1 is mounted to the circuit board, so as to ensure outstanding on-board mounting reliability.

Description is provided here of the numeric simulation with reference to FIG. 8.

FIG. 8 shows correlation between thickness "t2" of the bonding layer in the semiconductor device and number of life cycles, when the semiconductor device is mounted to a circuit board and subjected to repeated application of stress corresponding to thermal stress during an actual working condition. The axis of abscissas represents thickness (in mm) of the bonding layer and the axis of ordinates represents number of life cycles. Three different zigzag lines shown in FIG. 8 represent results of the simulation for number of life cycles against thermal fatigue (−40° C. to 125° C.) when modulus of elasticity of resin binder 5 is adjusted to (1) 400 Mpa, (2) 10,000 Mpa and (3) 27,500 Mpa respectively.

As is obvious from FIG. 8, the more the deformation of the semiconductor element with a lower modulus of elasticity of the bonding layer, the larger the number of life cycles and superiority in terms of reliability. In any of these results of simulation, the semiconductor device exhibits a tendency of increasing the life cycles sharply as thickness of the bonding layer increases within a range less than 0.05 mm. The number of life cycles then remains at generally a constant level in a range of thickness up to about 0.2 mm, and the number of life cycles decreases steeply when thickness increases beyond about 0.2 mm.

When the above results of simulation are interpreted from a practical point of view, they suggest that a semiconductor device of excellent on-board mounting reliability can be obtained by selecting a material of the bonding layer so that its modulus of elasticity becomes at most 10,000 Mpa, and setting a thickness of the bonding layer to a value in a range of 0.025 mm (25 μm) to 0.2 mm (200 μm). In manufacturing the semiconductor device, therefore, this exemplary embodiment uses resin binder 5 having a modulus of elasticity of at most 10,000 Mpa, and employs a fabricating method capable of adjusting the bonding layer accurately to a thickness of at least 0.025 mm but at most 0.2 mm.

Description is now provided of resin binder 5. As shown in FIG. 1B, resin binder 5 has a composition comprising a resin component such as epoxy resin as a main constituent with addition of granular filler 9 of inorganic material or resin. Filler 9 is to perform two functions at the same time. These functions being: (1) a fundamental function of providing the bonding layer with a desired characteristic (i.e. modulus of elasticity) after the resin binder 5 is formed into a bonding layer; and (2) a function as a spacer placed between semiconductor element 2 and plate 4 to provide the bonding layer with a predetermined thickness.

To achieve performance of these functions, filler 9 consisting of a combination of two materials, first filler 9a and second filler 9b, is mixed into resin binder 5 at a ratio of at most 30 percent by weight.

First filler 9a for providing the function of the above spacer consists of particles having diameter "d" which is generally equal to a target thickness "t2" of the bonding layer in the semiconductor device, wherein diameter "d" refers to a diameter of largest particles of filler 9 contained in resin binder 5. In other words, first filler 9a contains particles of the largest diameter in resin binder 5, and this diameter "d" is generally equal in dimension to a predetermined thickness of the bonding layer. Second filler 9b is an aggregate of fillers having a diameter smaller than diameter "d" of first filler 9a, and it is so selected as to have a suitable particle size distribution for accomplishing the fundamental function as the filler.

Figure 2A:
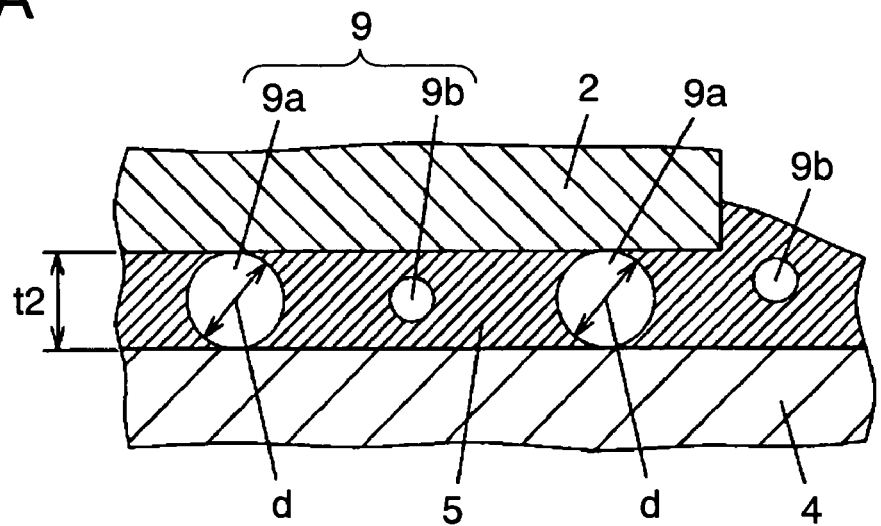
FIGS. 2A through 2C are sectional views showing parts of the semiconductor device of the first exemplary embodiment of the invention.

When semiconductor element 2 is placed on plate 4 via resin binder 5 containing first filler 9a and pressed against plate 4 with a predetermined pressure, first filler 9a of the largest diameter particles from among the fillers in resin binder 5 comes into contact with the back surface of semiconductor element 2 as well as a surface of plate 4, and sandwiched therebetween, as shown in FIG. 2A. This consequently makes the bonding layer into thickness "t2" which is generally equal to the diameter "d" of first filler 9a.

Figure 2B:
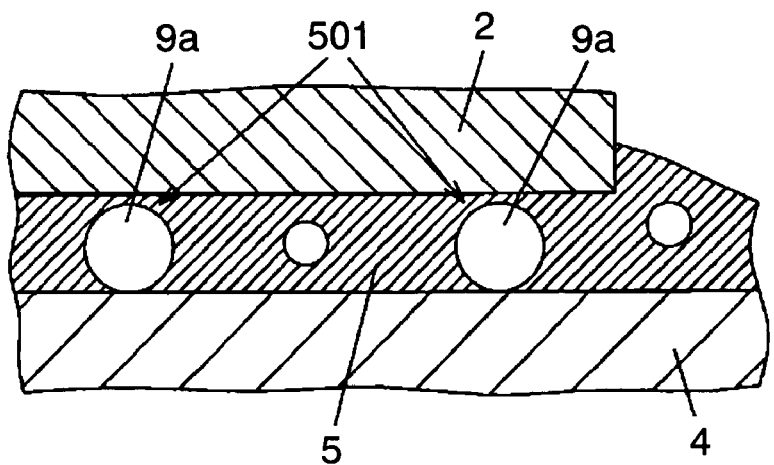

With semiconductor element 2 mounted in position via resin binder 5, however, there may be cases in which first filler 9a remains not in contact directly with any of semiconductor element 2 and plate 4, while a portion of resin layer 501 lies interfering as shown by arrows in FIG. 2B. Such an interference of resin layer 501 can occur: (1) if a value of pressure set for a mounting process is somewhat smaller than necessary to obtain condition of sufficient contact; (2) when resin binder 5 flows into interfaces of contact areas during a hardening process after mounting, even though first filler 9a once came into contact with each of semiconductor element 2 and plate 4 by application of pressure; and (3) if a method adopted for making first filler 9a come into contact is not compression, but some other manner of softening resin binder 5 when mounting the semiconductor element. Even in these cases, however, the bonding layer serves its intended function as a spacer because a thickness of it is nearly equal to the diameter of the particles of first filler 9a.

Figure 2C:
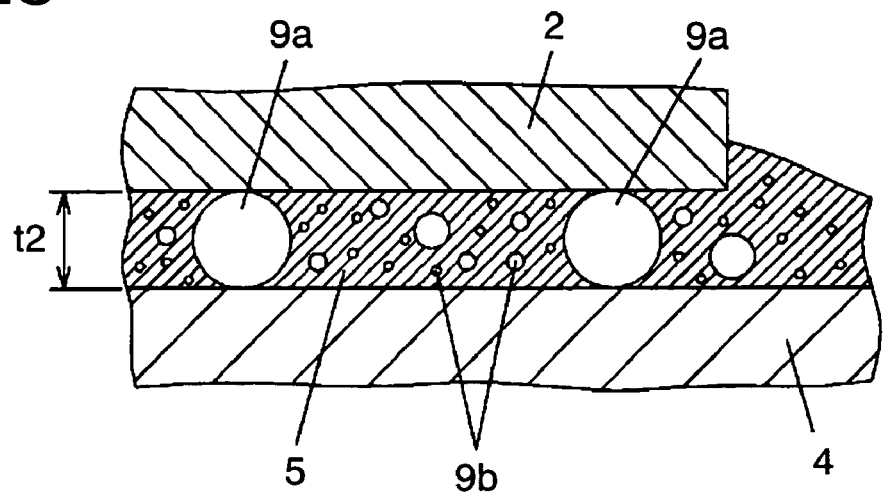

Percentages of first filler 9a and second filler 9b in resin binder 5 and particle size distribution of second filler 9b are so determined, and products so controlled, as to ensure that resin binder 5 positively accomplishes the spacer function as well as the fundamental function as the filler. In other words, percentage of content of first filler 9a is determined so that at least one particle of first filler 9a is included in the bonding layer of each semiconductor device, and resin binder 5 is thoroughly stirred to distribute the filler uniformly before using the resin binder. In addition, particle size distribution and percentage of content of second filler 9b are adjusted so that it contains particles of optimum sizes at an optimum ratio of mixture, as shown in FIG. 2C, to satisfy desired mechanical characteristics as well as heat conductive characteristics, so as to accomplish the fundamental function as the filler.

Inorganic material for use as filler 9 includes such substances as alumina, nitride aluminum and nitride silicon, which are less expensive, yet superior in terms of ability of heat dissipation. It is also suitable to use granular resin as first filler 9a, when more strict control is desired for thickness of the bonding layer since its particle size is easy to control. Resin filler, if used as first filler 9a, can avoid an excessive increase in hardness and embrittlement of the bonding layer as is a case when the resin filler contains inorganic material exhibiting a hard property. The resin filler also has an advantage of good affinity with resin binder 5. Besides, there is a potential risk of high pressure concentration at points of contact between first filler 9a and semiconductor element 2 due to compression during a mounting process, which can be a cause of damage to this thin semiconductor element. However, when first filler 9a is formed of a polymeric material having good plasticity, its cushioning effect can alleviate an excessive increase of pressure at the points of contact.

Resin binder 5 is pushed out from four side edges around semiconductor element 2, as shown in FIG. 1. The pushed-out portion of resin binder 5a rises up along side edges 2b of semiconductor element 2, and it settles into such a shape as to partially cover side edges 2b. This portion of resin binder 5a covering the side edges 2b has an effect of reinforcing the side edges of semiconductor element 2. In other words, semiconductor element 2 is liable to bearing small cracks around its edges as they are developed during a cutting process in which a semiconductor wafer is diced into individual pieces of semiconductor element 2, and these cracks can be a cause of damage. When resin binder 5a stays covering side edges 2b, the resin binder can reinforce the edges of semiconductor element 2 bearing such small cracks. Furthermore, when temperature of semiconductor device 1 rises while it is mounted to circuit board 10, a difference in thermal deformation between the circuit board and semiconductor element 2 produces stress which tends to deform semiconductor element 2 substantially. Resin binder 5a covering side edges 2b provides a function of preventing any such excessive deformation.

Figure 3A:
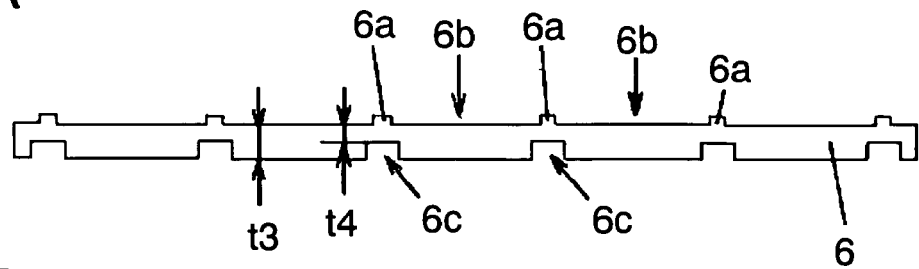
FIGS. 3A through 3E are diagrammatic illustrations representing a method of assembling the semiconductor device of the first exemplary embodiment of this invention.

Referring to FIGS. 3A–3E, description next pertains to a method of assembling semiconductor device 1. In FIG. 3A, plate-like member 6 is an intermediate component before it is cut into plates 4 to compose a part of semiconductor device 1. As shown in FIG. 4, plate-like member 6 is provided with raised partitions 6a in a lattice shape on an upper surface thereof. Recessed portions 6b enclosed by partitions 6a serve as semiconductor bonding areas where semiconductor elements 2 are bonded. Partitions 6a serve as dam barriers for preventing resin binder 5 from spreading over beyond the semiconductor bonding areas when resin binder 5 is applied inside recessed portions 6b for bonding semiconductor elements 2.

Plate-like member 6 is also provided with grooves 6c formed in positions on an underside surface corresponding to partitions 6a. Plate-like member 6 has a thickness equal to thickness "t3" of plate 4. Grooves 6c are formed by cutting lattice-patterned grooves from an underside of plate-like member 6, so as to provide thin portions having thickness "t4" smaller than thickness "t3" as measured from the upper surface. The thin portions correspond to cutting lines where plate-like member 6 is diced and separated into individual plates 4.

Figure 3B:
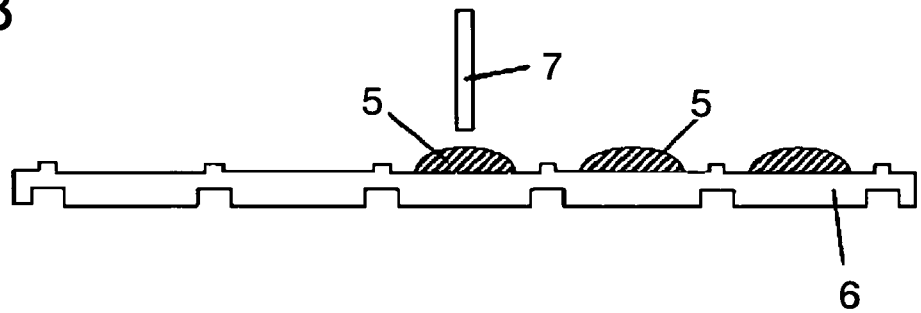
Figure 4:
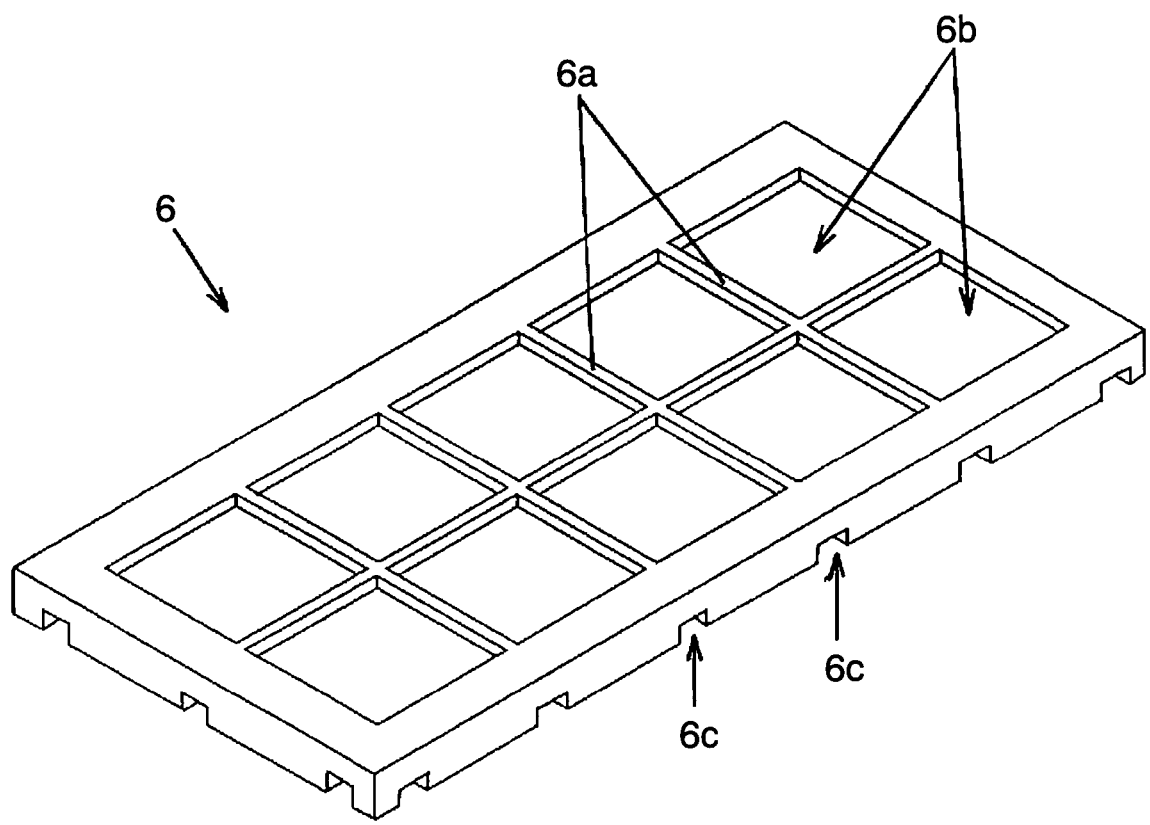
FIG. 4 is a perspective view showing a plate-like member used in producing the semiconductor device of the first exemplary embodiment of this invention.

Resin binder 5 is then applied to recessed portions 6b in plate-like member 6 via dispenser 7, as shown in FIG. 3B. Resin binder 5 supplied here is to form bonding layers where semiconductor elements 2 are bonded. Since partitions 6a are provided around recessed portions 6b, resin binder 5 is prevented from spreading around beyond semiconductor bonding areas during application of resin binder 5. Resin binder 5 is so adjusted that it contains at least one particle of first filler 9a when coated in each of recessed portions 6b.

During application, resin binder 5 of an appropriate amount corresponding to the aforementioned thickness "t2" of the bonding layer, neither too much nor too little, is discharged from dispenser 7, so that the resin binder properly covers side edges 2b of semiconductor element 2, as described previously, when it is pressed after application with semiconductor element 2, in a manner to spread outwardly beyond the side edges of semiconductor element 2.

Figure 3C:
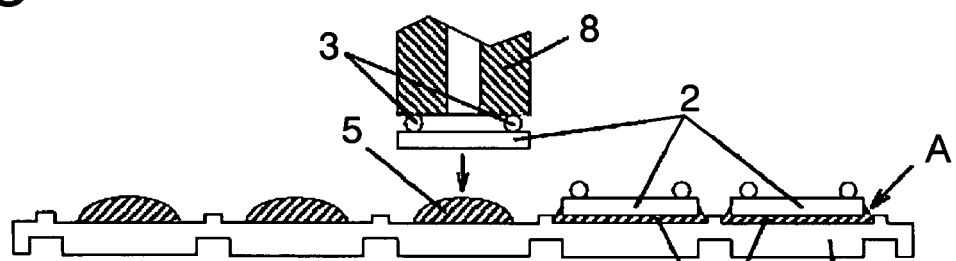
Figure 3D:
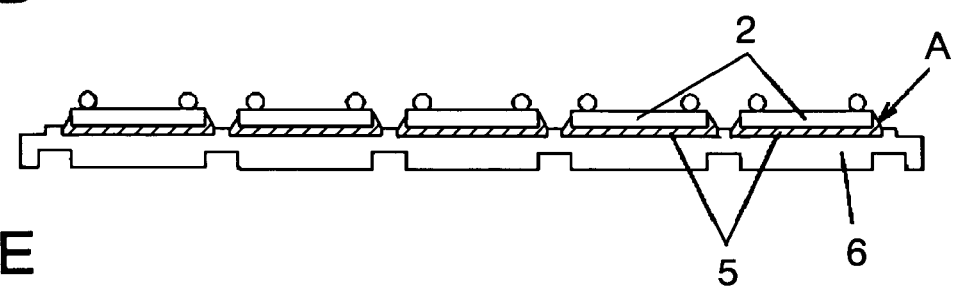
Figure 3E:
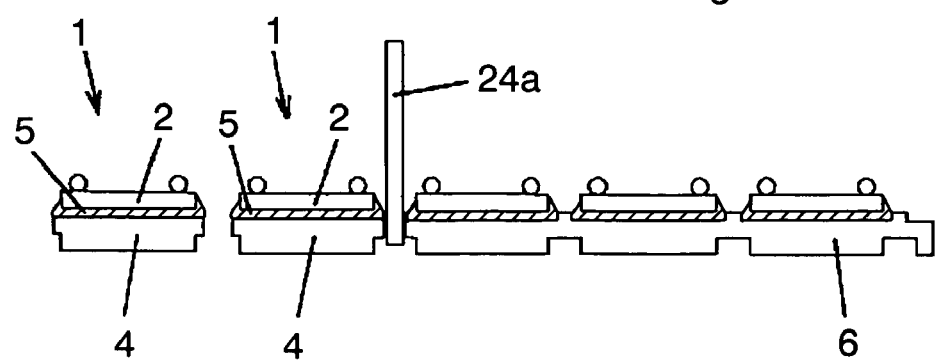

After resin binder 5 is applied, plate-like member 6 is transferred to a semiconductor bonding process. During this semiconductor bonding process, semiconductor element 2 is put on resin binder 5 applied to plate-like member 6, and resin binder 5 is subsequently heated to harden thermally, as shown in FIGS. 3C and 3D. During this process, a plurality of aligned semiconductor elements 2 are bonded on their back sides to individual recessed portions 6b of plate-like member 6 with resin binder 5.

Figure 5:
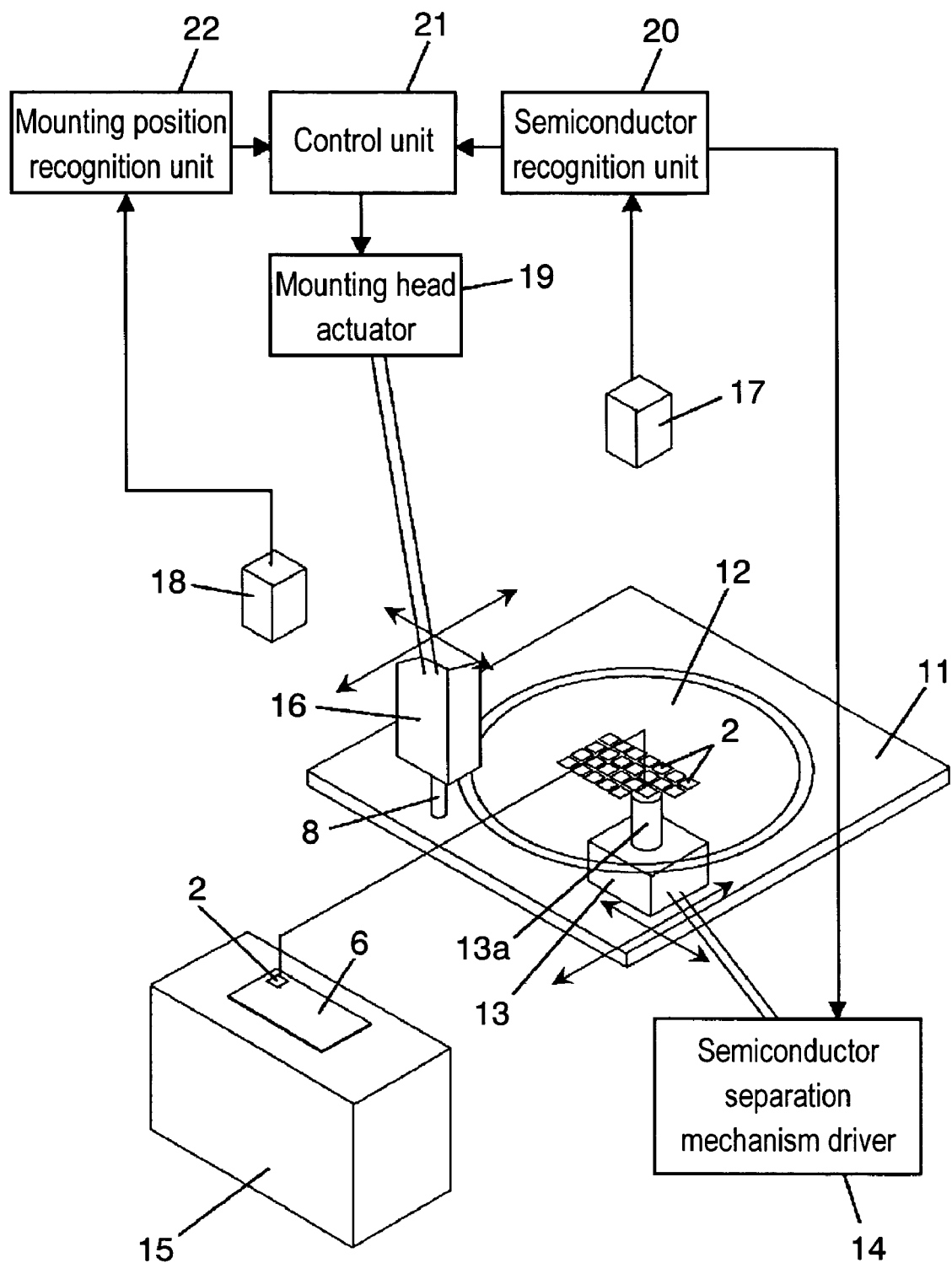
FIG. 5 is a perspective view of an electronic component mounting apparatus used for assembling the semiconductor device of the first exemplary embodiment of this invention.

Referring to FIG. 5, description is provided of an electronic component mounting apparatus used for mounting semiconductor elements 2. In FIG. 5, component supply table 11 is provided with adhesive sheet 12 carrying semiconductor elements 2 arranged in a lattice pattern. There is semiconductor separating mechanism 13 disposed below component supply table 11. Semiconductor separating mechanism 13 is driven by semiconductor separating mechanism driver 14. When mounting head 16 picks up one of semiconductor elements 2, ejector pin mechanism 13a pushes up a lower side of adhesive sheet 12 to separate semiconductor element 2 from an upper surface of adhesive sheet 12.

Base plate holder 15 is located next to component supply table 11, and base plate holder 15 holds plate-like member 6 bearing a resin binder supplied thereto. There is mounting head 16 disposed above component supply table 11 and base plate holder 15, and it is driven by mounting head actuator 19. Mounting head 16 is provided with suction nozzle 8, which picks up semiconductor element 2 from adhesive sheet 12, and mounts it to plate-like member 6 on base plate holder 15.

There is also camera 17 positioned above component supply table 11 for taking an image of semiconductor element 2 adhered to adhesive sheet 12. Semiconductor recognition unit 20 performs a recognition process on the image taken by camera 17 to recognize a position of semiconductor element 2 on adhesive sheet 12. A result of this positional recognition is sent to control unit 21 and semiconductor separating mechanism actuator 14. As a result, suction nozzle 8 and ejector pin mechanism 13a are aligned in position relative to semiconductor element 2 to be picked up when using mounting head 16 to pick up semiconductor element 2.

Another camera 18 is located above base plate holder 15, and it takes an image of plate-like member 6 held by base plate holder 15. Mounting position recognition unit 22 performs a recognition process on the image taken by camera 18 to perceive a mounting position of the semiconductor element in plate-like member 6. A result of this positional recognition is sent to control unit 21. Control unit 21 controls mounting head actuator 19 according to this result of positional recognition to align a position of semiconductor element 2 held by suction nozzle 8 when semiconductor element 2 is being mounted by mounting head 16.

When mounting semiconductor element 2 onto plate-like member 6 by using this electronic component mounting apparatus, suction nozzle 8 sucks and hold semiconductor element 2 on its surface where bumps 3 are formed, as shown in FIG. 3C, and presses a back surface of semiconductor element 2 against resin binder 5. A proper pressure is used to press semiconductor element 2 against plate-like member 6 during this process to form a bonding layer between semiconductor element 2 and plate-like member 6 into thickness "t2" that is generally equal in dimension to that of diameter "d" of first filler 9a contained in resin binder 5 (refer to FIG. 2A).

The above process of pressing causes a portion of resin binder 5 to flow out around side edges of semiconductor element 2 (refer to arrow A) and rises up along side edges 2b of semiconductor element 2 to cover the side edges 2b (refer to resin binder 5a shown in FIG. 1B). Resin binder 5 serves its purpose when it covers and reinforces throughout the edges of only the back side of semiconductor element 2, since a dicing process is likely to cause damage only in back side edges. It is therefore appropriate to cover the side edges 2b either completely or partially.

Since semiconductor elements 2 are mounted one after another by being pressed against resin binder 5 with mounting head 16, a mounting load (i.e. pressing force) can be reduced in this exemplary embodiment, as compared to other cases in which a group of semiconductor elements 2 are mounted (adhered) at once. This allows flexibility of selecting any of a die-bonding apparatus, a chip mounter, and the like as the electronic component mounting apparatus.

Plate-like member 6 thus equipped with semiconductor element 2 is transferred to a heating furnace. Resin binder 5 is thermally hardened as shown in FIG. 3D when it is heated to a predetermined temperature in the heating furnace. During this process of hardening, the flow-out portion of resin binder 5 rises further along side edges 2b of semiconductor element 2 due to an effect of surface tension since its viscosity decreases temporarily, and it is then hardened into a shape to cover the side edges 2b. Accordingly, resin binder 5a is formed as a reinforcing rim in a shape shown in FIG. 1B once resin binder 5 is hardened.

In the above exemplary embodiment, description is given of an example in which resin binder 5 is thermally hardened in the heating furnace after semiconductor element 2 is mounted to plate-like member 6. However, the heating furnace may be replaced with mounting head 16 having a built-in heating device so that plate-like member 6 can be heated while mounting semiconductor element 2.

The separate heating process shown in FIG. 3D can be omitted when mounting head 16 is used for heating of the resin binder. This provides for an advantage of omitting the heating furnace and simplifying equipment. In this case, however, productivity in its entirety may be decreased when compared with the above example in which the mounting process and the heating process are performed separately, because a cycle time of mounting head 16 is constrained by duration of hardening time of the resin binder. In addition, although the above example of this exemplary embodiment indicates use of a thermosetting material as resin binder 5, it can be replaced with thermoplastic resin material.

After resin binder 5 is thus hardened, plate-like member 6 bearing semiconductor elements 2 is transferred to a cutting process, where it is cut with rotary cutting blade 24a along the cutting lines between adjoining semiconductor elements 2, as shown in FIG. 2E. This process cuts and separates plate-like member 6 into plates 4 with individual semiconductor elements 2, to complete assembly of semiconductor devices 1.

Figure 6:
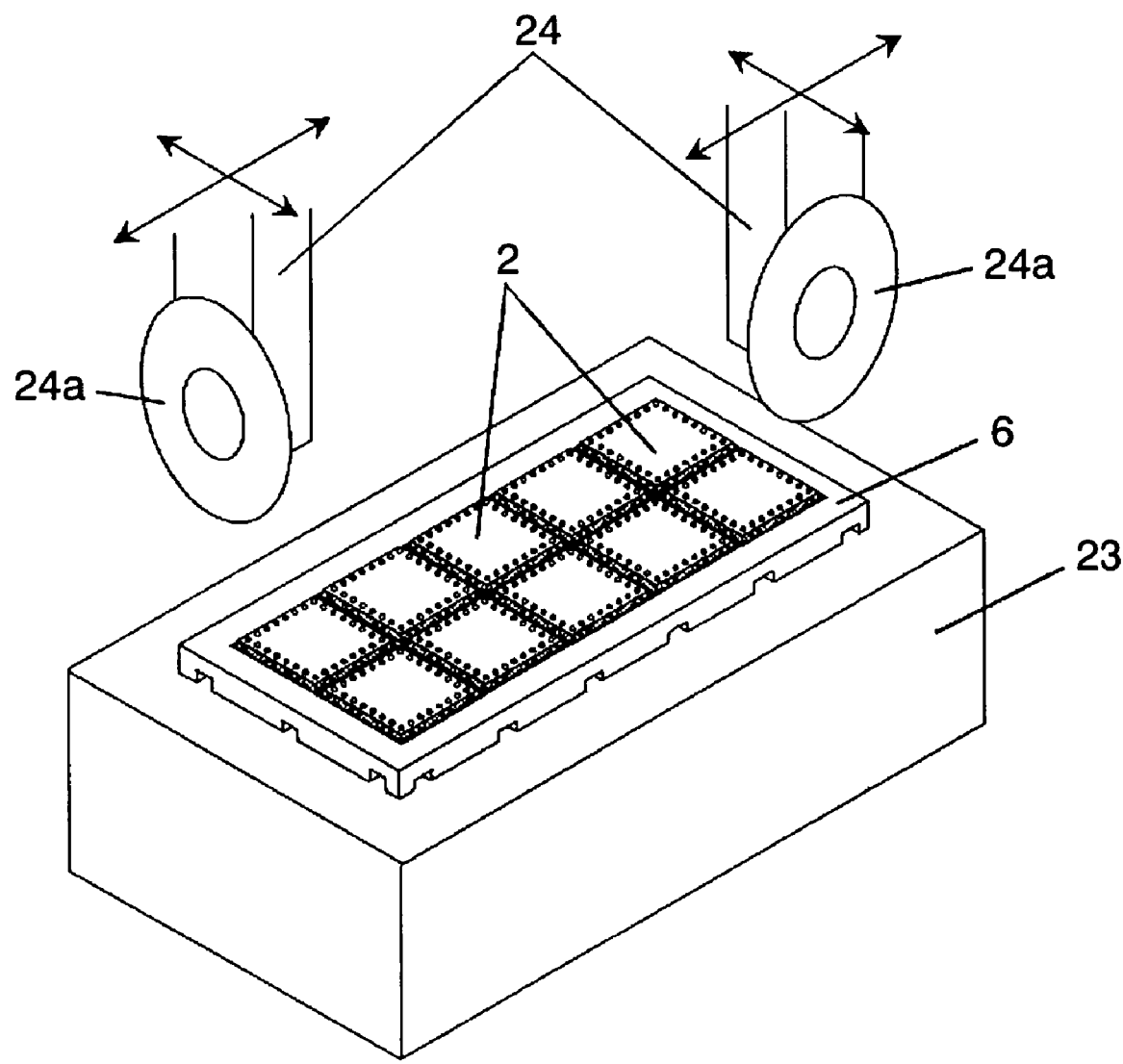
FIG. 6 is a perspective view of a dicing apparatus used for assembling the semiconductor device of the first exemplary embodiment of this invention.
Figure 7:
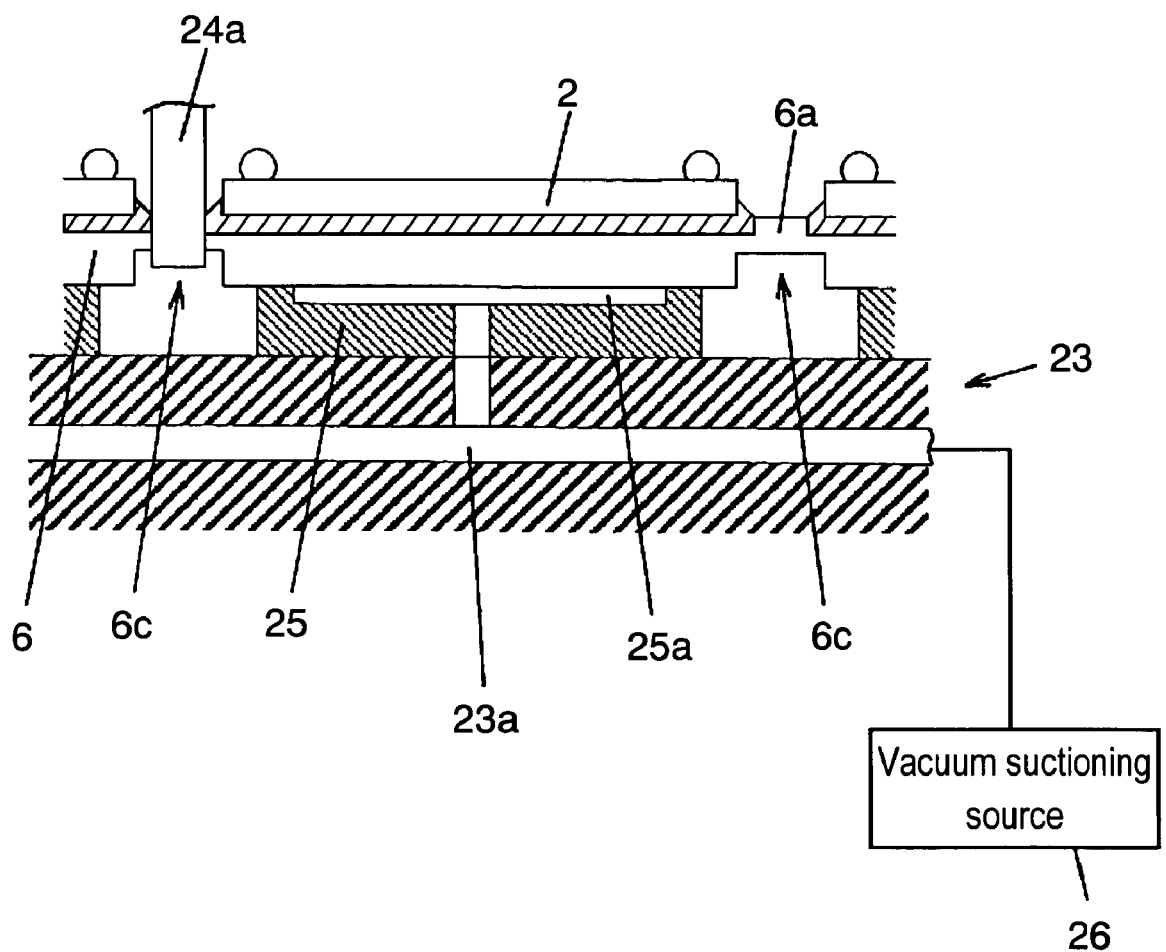
FIG. 7 is a sectional view of a portion of the dicing apparatus used for assembling the semiconductor device of the first exemplary embodiment of this invention.

This cutting process is further described with reference to FIG. 6 and FIG. 7. FIG. 6 shows a dicing apparatus used for this cutting process. Upon completion of mounting semiconductor elements 2 and hardening the resin binder, plate-like member 6 is placed on plate fixing table 23. Cutting heads 24 provided with rotary cutting blades 24a are arranged above plate fixing table 23. While rotary cutting blades 24a are driven in rotation, cutting heads 24 are moved in the X-direction and the Y-direction to cut plate-like member 6 along cutting lines corresponding to grooves 6c.

Suctioning retainers 25 are arranged on an upper surface of plate fixing table 23, one at each position corresponding to semiconductor element 2 on plate-like member 6. Suctioning channel 25a is formed in an upper surface of each suctioning retainer 25, as shown in FIG. 7. Suctioning channel 25a is in communication with suctioning hole 23a provided inside plate fixing table 23, and suctioning hole 23a is connected to vacuum suctioning source 26. Plate-like member 6 is sucked and held by suctioning retainer 25 to remain fixed in position when vacuum suctioning source 26 is operated with plate-like member 6 placed on its backside in contact with suctioning retainer 25.

Rotary cutting blades 24a are then aligned in positions above partitions 6a of plate-like member 6, which is held fixed to its position as described, so that plate-like member 6 is cut along thin portions inside grooves 6c when rotary cutting blades 24a are lowered while being rotated. Each rotary cutting blade 24a used for this process has a blade width of smaller than a space between adjoining semiconductor elements 2, so as to cut plate-like member 6 into separate pieces in such a shape that a perimeter of plate 4 extends beyond the side edges of semiconductor element 2. Accordingly, an external size of plate 4 is larger than that of semiconductor element 2 after it is separated into individual pieces.

During this cutting process, a thickness to be cut through by rotary cutting blades 24a is small because grooves 6c are formed beforehand in the underside surface of plate-like member 6. This can reduce to the utmost an amount of downward movement required during the cutting process of rotary cutting blades 24a, and prevent an incident of a tip of the cutting blade coming into contact with plate fixing table 23 and damaged when the cutting blade is moved downwardly.

In this exemplary embodiment, although description is given of resin binder 5 of paste form, it can be resin adhesive of a sheet form or a tape form, which can be used in such a manner that it is placed on either of plate-like member 6 or semiconductor element 2 to bond them together.

Second Exemplary Embodiment

Figure 9A:
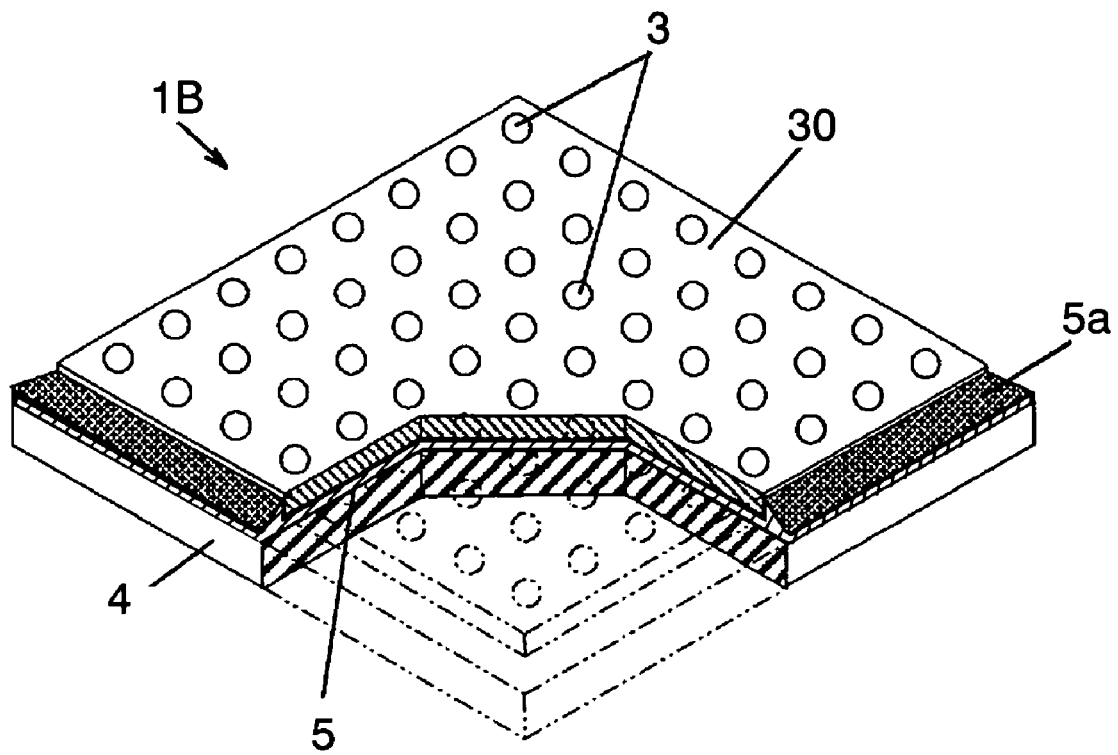
FIG. 9A is a perspective view of a semiconductor device according to a second exemplary embodiment of this invention.
Figure 9B:
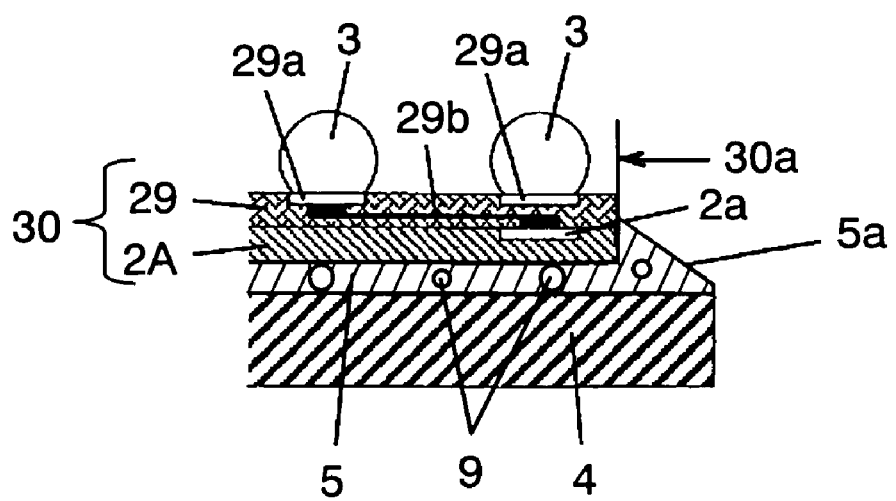
FIG. 9B is a sectional view showing a part of the semiconductor device of the second exemplary embodiment of this invention.

Description is provided now of a semiconductor device of the second exemplary embodiment of this invention with reference to FIG. 9A and FIG. 9B.

In FIG. 9A, semiconductor device 1B has a structure in which plate 4 (i.e. a structural member) is bonded to a back surface of semiconductor element 30, having a re-wiring layer, via a bonding layer of the same resin binder 5 as that of the first exemplary embodiment. Semiconductor element 30 having re-wiring layer is provided with a plurality of bumps 3 formed into a lattice pattern on a surface thereof. Semiconductor element 30 having a re-wiring layer has a structure as shown in FIG. 9 B in which re-wiring layer 29 is formed on a surface (i.e. one of surfaces where electrodes are formed) of semiconductor element 2A which has undergone a thinning process in the same manner as semiconductor element 2 described in the first exemplary embodiment.

Electrodes 2a serving as terminals for external connections are formed along a fringe on a surface of semiconductor element 2A, and each of electrodes 2a is electrically connected through internal wiring 29b to a corresponding one of electrodes 29a formed in the same amount as electrodes 2a on a surface of re-wiring layer 29. Electrodes 29a bear bumps 3 formed thereon for mounting of semiconductor device 1B. This semiconductor device 1B can be assembled by simply substituting semiconductor element 2 with semiconductor element 30, having the re-wiring layer, in the method of assembling a semiconductor device as discussed in the first exemplary embodiment.

This produces flow-out of resin binder 5a around side edges 30a of semiconductor element 30 carrying the re-wiring layer, and forms a reinforcing rim to cover the side edges 30a. In semiconductor device 1B of such structure, the reinforcing rim formed to cover side edges 30a of semiconductor element 30 carrying the re-wiring layer can prevent bending and deformation developed in edges of semiconductor element 30 after mounting, and avoids internal wiring 29b inside re-wiring layer 29 from being broken.

Resin binder 5 of paste form and sheet form (or a tape form) can also be used in this exemplary embodiment.

Third Exemplary Embodiment

Referring to FIGS. 10A–10B, FIGS. 11A–11C, FIGS. 12A–12C and FIGS. 13A–13C, description is provided of a base plate bonding apparatus of a third exemplary embodiment of this invention.

Figure 10A:
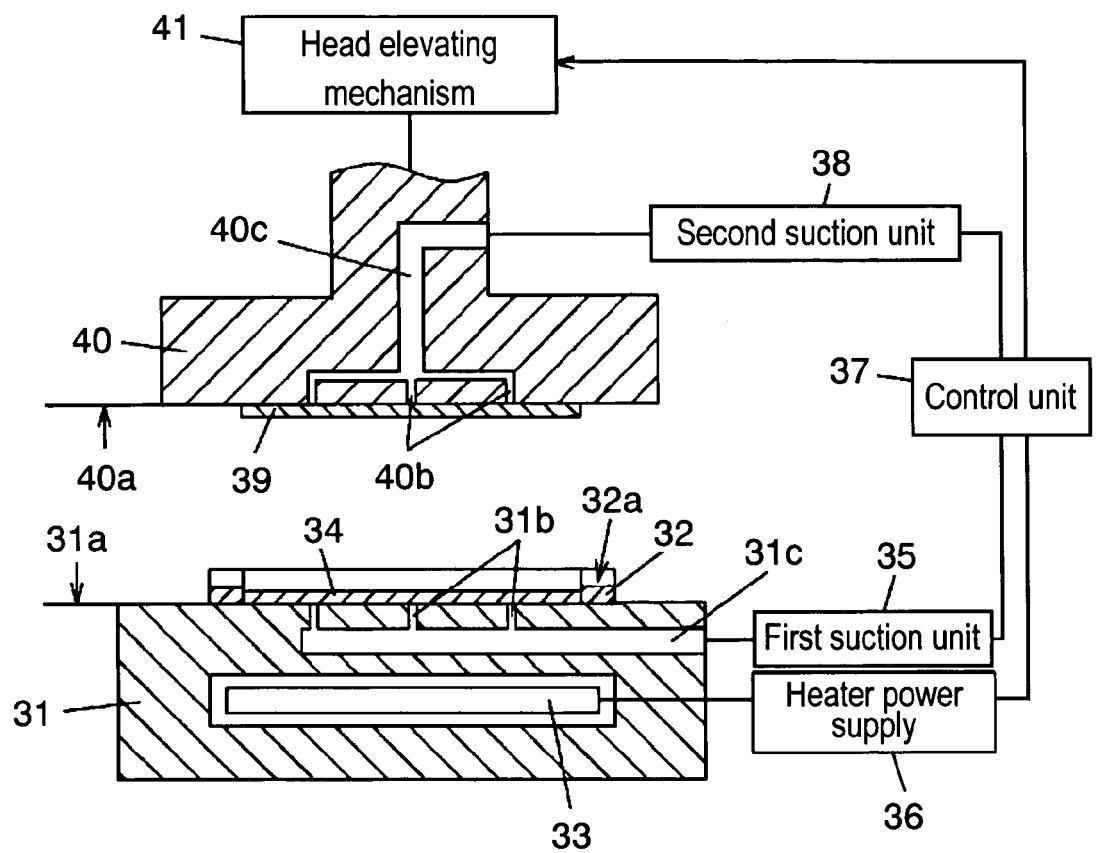
FIG. 10A is a sectional view of a base plate bonding apparatus according to a third exemplary embodiment of this invention.
Figure 10B:
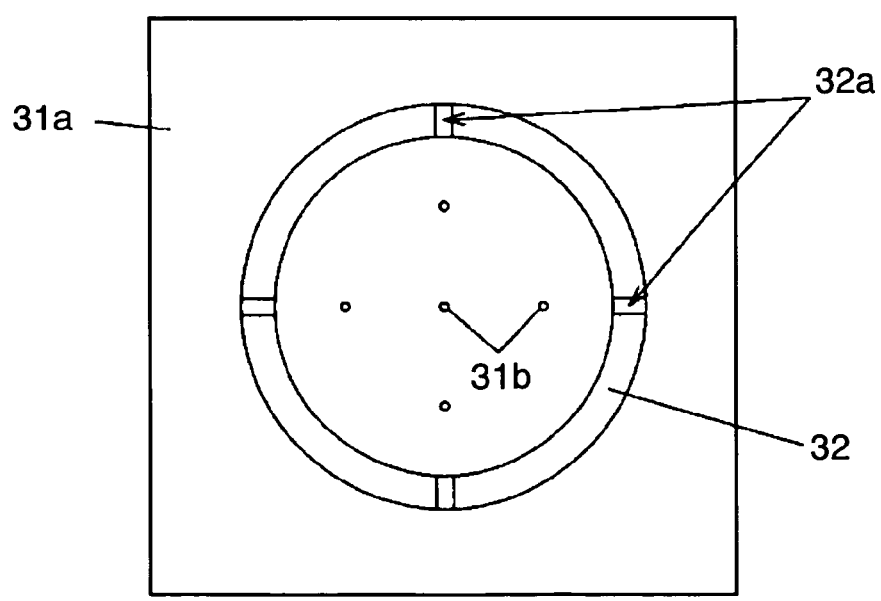
FIG. 10B is a plan view of the base plate bonding apparatus of the third exemplary embodiment of this invention.

A structure of the base plate bonding apparatus is described first with reference to FIGS. 10A and 10B. This base plate bonding apparatus is used in a process of manufacturing a semiconductor device, which comprises a semiconductor element and a reinforcing member bonded to a backside of an electrode-bearing surface of the semiconductor element on which electrodes for external connections are formed, via resin binder, wherein the apparatus bonds together a semiconductor wafer having a plurality of semiconductor elements constructed thereon with a reinforcing sheet in an original form prior to being cut individually into separate pieces of reinforcing members.

In FIG. 10A, an upper surface of retaining table 31 constitutes wafer retaining space 31a on which semiconductor wafer 34 is retained. Spacer ring 32 is fixed to wafer retaining space 31a, and semiconductor wafer 34, after being subjected to a thinning process using such methods as machine grinding and the like, is placed inside of spacer ring 32. Spacer ring 32 is an annularly shaped fixture which has an inner diameter conforming to an outer diameter of semiconductor wafer 34 as well as that of reinforcing sheet 39 to be bonded. Spacer ring 32 is provided with cutout slits 32a at a plurality of locations on an upper surface thereof. Cutout slits 32a function as resin discharge gates for draining extra resin binder to an exterior during a process of bonding semiconductor wafer 34 to reinforcing sheet 39, as will be described later.

Wafer retaining space 31a inside spacer ring 32 has suctioning holes 31b (refer also to FIG. 10B), which are in communication with first suction unit 35 via suction path 31c. When first suction unit 35 is driven, it draws vacuum from suctioning holes 31b, which suck and retain semiconductor wafer 34 on wafer retaining space 31a. Wafer retaining space 31a, suctioning holes 31b and first suction unit 35 constitute a retaining structure for semiconductor wafer 34. Retaining table 31 has built-in heater 33, which heats semiconductor wafer 34 placed on wafer retaining space 31a when electric power is supplied to heater 33 by heater power supply 36.

Retaining head 40 is positioned above retaining table 31 in a vertically slidable manner by elevating mechanism 41. An underside surface of retaining head 40 defines sheet retaining surface 40a which retains reinforcing sheet 39. Sheet retaining surface 40a is adjusted in terms of its parallelism so as to maintain it parallel with respect to wafer retaining space 31a on retaining table 31. Sheet retaining surface 40a has suctioning holes 40b, which are in communication with second suction unit 38 through suctioning path 40c. When second suction unit 38 is driven, it draws vacuum from suctioning holes 40b, which suck and retain reinforcing sheet 39 onto sheet retaining surface 40a. Sheet retaining surface 40a, suctioning holes 40b and second suction unit 38 constitute a retaining structure for reinforcing sheet 39.

Reinforcing sheet 39 is fabricated of a material such as resin, ceramic and metal into a thin plate of circular shape. This plate is cut and individual semiconductor elements are separated to form semiconductor devices, so that each functions as a retaining sheet for handling a semiconductor device as well as a reinforcing member for protecting the semiconductor device from external forces and impacts. Accordingly, reinforcing sheet 39 has a thickness necessary to maintain sufficient strength to protect a thin semiconductor device.

First suction unit 35, second suction unit 38, heater power supply 36 and head actuator 41 are controlled individually by control unit 37. By controlling these components, control unit 37 executes a bonding process of semiconductor wafer 34 to reinforcing sheet 39, as described hereinafter.

Figure 11A:
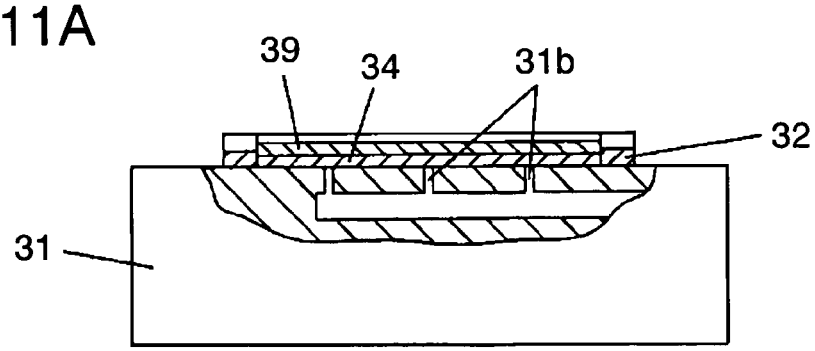
FIGS. 11A through 11C are diagrammatic illustrations showing a method of manufacturing a semiconductor device according to the third exemplary embodiment of this invention.
Figure 11B:
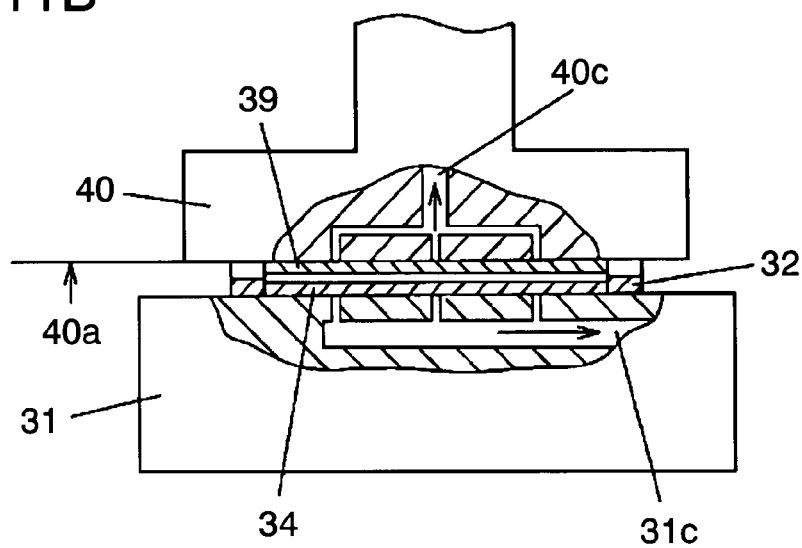

First, semiconductor wafer 34 is positioned inside spacer ring 32 on retaining table 31, with its circuit-bearing surface facing downward as shown in FIG. 11A, and reinforcing sheet 39 is placed on top of semiconductor wafer 34. Next, retaining head 40 is lowered toward retaining table 31 until it comes into abutment with spacer ring 32, as shown in FIG. 11B. While vacuum is being suctioned through suctioning path 31c to keep semiconductor wafer 34 retained on retaining table 31, vacuum is also suctioned from suctioning path 40c in retaining head 40 to suck and pick up reinforcing sheet 39 from inside of spacer ring 32 onto sheet retaining surface 40a.

Figure 11C:
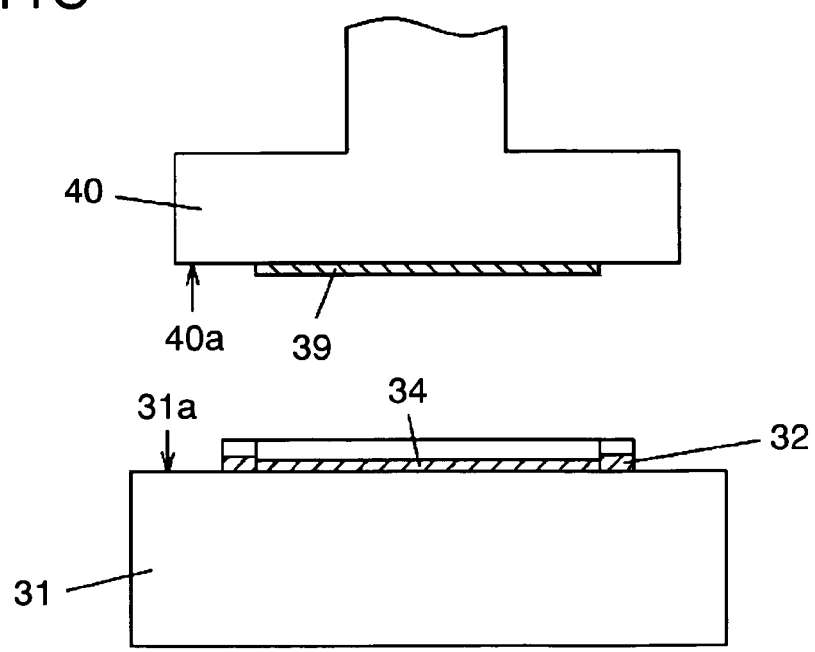
Figure 12A:
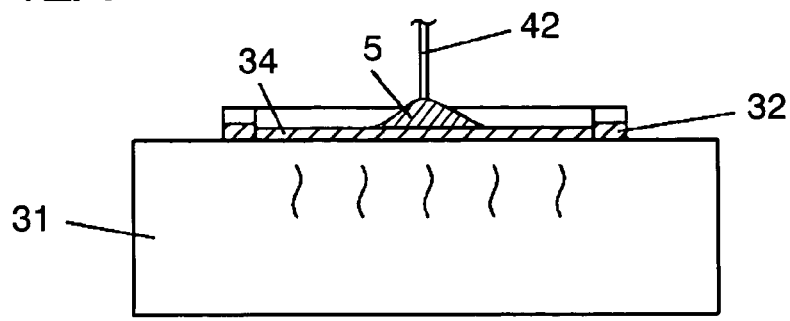
FIGS. 12A through 12C are diagrammatic illustrations also showing the method of manufacturing a semiconductor device according to the third exemplary embodiment of this invention.

When retaining head 40 is subsequently moved upward, reinforcing sheet 39 is kept retained on sheet retaining surface 40a of retaining head 40 while semiconductor wafer 34 is retained in wafer retaining space 31a in retaining table 31, as shown in FIG. 11C. Next, resin binder 5 of thermosetting property having the same composition as that of the first exemplary embodiment is supplied by dispenser 42 to a central area on a surface of semiconductor wafer 34 inside spacer ring 32, as shown in FIG. 12A.

Figure 12B:
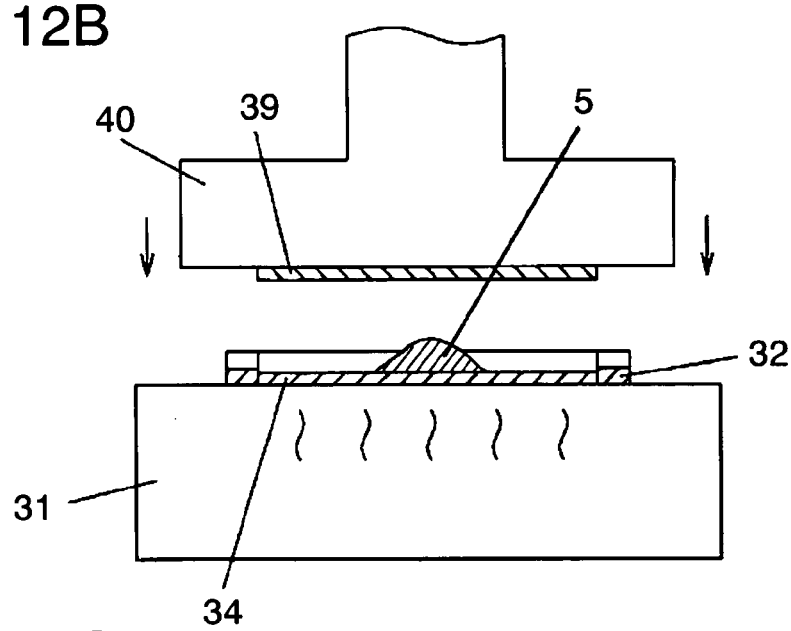

Retaining table 31 is heated by heater 33 during this time. Since this heat temporarily lowers viscosity of resin binder 5, the resin binder starts flowing into a bulgy shape, with a larger thickness at its center than at its periphery, on the surface of semiconductor wafer 34. Retaining head 40 is then lowered toward retaining table 31 while still retaining reinforcing sheet 39 thereon, as shown in FIG. 12B. That is, after the process of resin supply, semiconductor wafer 34 and reinforcing sheet 39 are moved closer to each other while maintaining their parallel position. During this process, a bottom side of reinforcing sheet 39 comes into contact with resin binder 5, and pushes resin binder 5 such that it spreads.

Figure 12C:
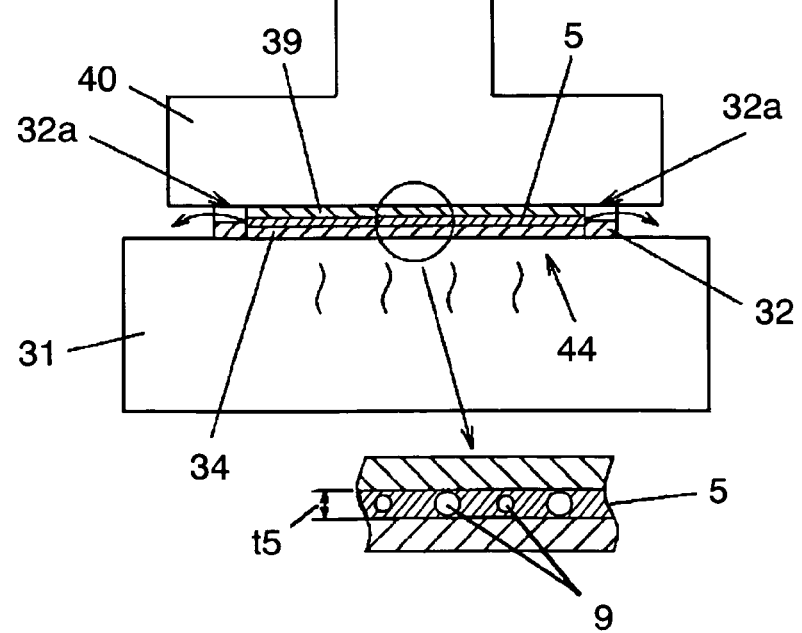

Since resin binder 5 is discharged into the bulgy shape, or a lump of convex form, it is pushed to spread gradually from its center toward its periphery. This process of spreading is quite effective in preventing air from being trapped inside resin binder 5, so as not to produce voids therein. Further compression of retaining head 40 at a predetermined pressure fills a space between semiconductor wafer 34 and reinforcing sheet 39 completely with liquefied resin binder 5, as shown in FIG. 12C, and drains an extra amount of resin binder 5 to an exterior from cutout slits 32a provided in spacer ring 32. Because resin binder 5 contains first filler 9a like that of the first exemplary embodiment, a bonding layer formed of resin binder 5 is kept at a predetermined thickness which is generally equal to the diameter "d" of first filler 9a.

Heater 33 continues to heat retaining table 31 under this condition to advance a heat curing reaction of resin binder 5 in the space between semiconductor wafer 34 and reinforcing sheet 39. This causes resin binder 5 to complete the bonding of semiconductor wafer 34 to reinforcing sheet 39. Resin binder 5 needs not be cured completely during this process of resin-hardening, so long as resin binder 5 is hardened to such a degree that integrated body 44 can maintain a desired shape. In the above example, although semiconductor wafer 34 and reinforcing sheet 39 are retained by retaining table 31 and retaining head 40 respectively, they can be reversed upside down so that resin binder 5 may be supplied onto reinforcing sheet 39 which is retained on retaining table 31.

Figure 13A:
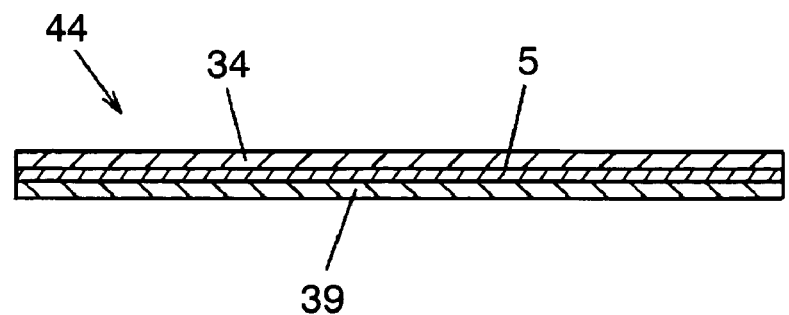
FIGS. 13A through 13C are diagrammatic illustrations also showing the method of manufacturing a semiconductor device according to the third exemplary embodiment of this invention.
Figure 13B:
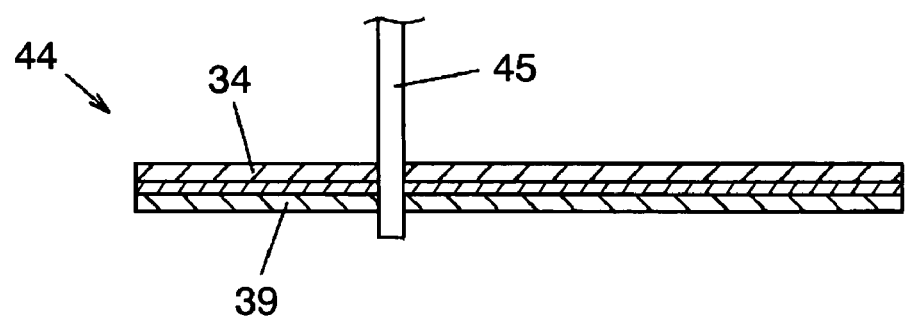
Figure 13C:
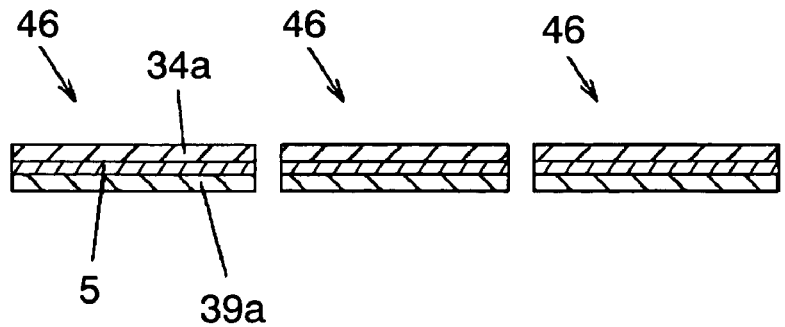

Integrated body 44 comprising semiconductor wafer 34 bonded to reinforcing sheet 39 as shown in FIG. 13A is completed when it is removed from spacer ring 32, and this integrated body 44 is transferred next to a dicing process. In other words, integrated body 44 is cut through from semiconductor wafer 34 side with dicing tool 45 as shown in FIG. 13B, and separated into individual pieces. This completes semiconductor device 46 having plate 39a bonded to semiconductor element 34a, as shown in FIG. 13C.

In the semiconductor device discussed in each of the first, second and third exemplary embodiments, the bonding layer for bonding the semiconductor element to the reinforcing plate is formed to be easily deformable by setting its modulus of elasticity to at most 10,000 Mpa. In addition, a thickness of the bonding layer is adjusted to a proper range (i.e. between 25 μm and 200 μm) in order to ensure reliability of the semiconductor device after being mounted. Furthermore, the resin binder used to form the bonding layer is so arranged as to contain fillers of which particle sizes are controlled to obtain a function of ensuring a proper thickness of the bonding layer. As a result, the invention makes possible control of thickness of the bonding layer, and to ensure reliability of the semiconductor device after it is mounted, without requiring complicated control during an assembling process of the semiconductor device.

The present invention provides a semiconductor device of outstanding on-board mounting reliability since it comprises a resin bonding layer, of which a thickness can be adjusted to a proper value within a range of 25 μm to 200 μm, for bonding a plate to a semiconductor element.

The invention claimed is:

1. A semiconductor device to be mounted onto a circuit board, comprising:
    a semiconductor element having a thickness of at most 100 μm, said semiconductor element having a first surface bearing a terminal for external connection, and a second surface opposite said first surface;
    a bump on said terminal for external connection;
    a plate confronting said second surface; and
    a bonding layer between said second surface and said plate such that said semiconductor element is bonded to said plate via said bonding layer, said bonding layer having a thickness within a range of from 25 μm to 200 μm,
    wherein said bonding layer contains filler functioning as a spacer between said semiconductor element and said plate so as to provide said bonding layer with a predetermined thickness.

2. The semiconductor device according to claim 1, wherein said filler is in contact with said second surface of said semiconductor element and said plate.

3. The semiconductor device according to claim 1, wherein said filler includes any of inorganic material and polymeric material.

4. The semiconductor device according to claim 1, wherein said bonding layer contains filler having at least two different particle sizes, with at least one of said particle sizes being generally equal in dimension to the thickness of said bonding layer.

5. The semiconductor device according to claim 1, wherein said bonding layer contains first filler and second filler,
with said first filler having a size generally equal to the thickness of said bonding layer, and said second filler having a particle size distribution in sizes smaller than the size of said first filler.

6. The semiconductor device according to claim 5, wherein an aggregate percentage of content of said first filler in said bonding layer is at most 30 percent by weight.

7. The semiconductor device according to claim 5, wherein an aggregate percentage of content of said first filler and said second filler in said bonding layer is at most 30 percent by weight.

8. The semiconductor device according to claim 1, wherein
said first surface has a re-wiring layer thereon, with said re-wiring layer having a surface electrode formed on a surface thereof and an internal electrode formed inside thereof,
with said internal electrode being in communication with said surface electrode and said terminal for external connection.

9. The semiconductor device according to claim 8, further comprising bump on said surface electrode.

10. The semiconductor device according to claim 1, wherein said plate has an external shape larger than an external shape of said semiconductor element, and said bonding layer covers a side edge of said semiconductor element.

* * * * *